(12) United States Patent
Mulfinger et al.

(10) Patent No.: US 11,101,364 B2
(45) Date of Patent: Aug. 24, 2021

(54) FIELD-EFFECT TRANSISTORS WITH DIFFUSION BLOCKING SPACER SECTIONS

(71) Applicant: GLOBALFOUNDRIES U.S. Inc., Santa Clara, CA (US)

(72) Inventors: George R. Mulfinger, Gansevoort, NY (US); Hong Yu, Clifton Park, NY (US); Man Gu, Malta, NY (US); Jianwei Peng, Clifton Park, NY (US); Michael Aquilino, Gansevoort, NY (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 27 days.

(21) Appl. No.: 16/296,769

(22) Filed: Mar. 8, 2019

(65) Prior Publication Data

US 2020/0287019 A1 Sep. 10, 2020

(51) Int. Cl.
*H01L 29/66* (2006.01)
*H01L 29/78* (2006.01)
*H01L 21/311* (2006.01)

(52) U.S. Cl.
CPC .... *H01L 29/66545* (2013.01); *H01L 29/6653* (2013.01); *H01L 29/6656* (2013.01); *H01L 29/66553* (2013.01); *H01L 29/66795* (2013.01); *H01L 29/785* (2013.01); *H01L 21/31111* (2013.01)

(58) Field of Classification Search
CPC ......... H01L 29/66545; H01L 29/66795; H01L 29/6653; H01L 29/6656; H01L 29/66553; H01L 29/785
See application file for complete search history.

(56) References Cited

U.S. PATENT DOCUMENTS

| 10,431,661 | B2 | 10/2019 | Liu et al. | |
|---|---|---|---|---|
| 2014/0131735 | A1* | 5/2014 | Hoentschel | H01L 21/84 |
| 2015/0145073 | A1* | 5/2015 | Lee | H01L 29/6656 257/411 |
| 2015/0357440 | A1 | 12/2015 | Cheng et al. | |
| 2015/0380514 | A1 | 12/2015 | Bentley et al. | |
| 2016/0099245 | A1* | 4/2016 | Cheng | H01L 29/78 257/401 |
| 2018/0261610 | A1* | 9/2018 | Zheng | H01L 29/6656 |
| 2019/0057899 | A1 | 2/2019 | Huang et al. | |
| 2020/0020770 | A1* | 1/2020 | Qi | H01L 29/78618 |
| 2021/0036143 | A1 | 2/2021 | Liao et al. | |

FOREIGN PATENT DOCUMENTS

TW 201732943 A 9/2017
TW 201813100 A 4/2018

OTHER PUBLICATIONS

Taiwan Intellectual Property Office, Official Action dated Jan. 20, 2021 in Taiwanese Patent Application No. 109103897.

* cited by examiner

*Primary Examiner* — Anthony Ho
(74) *Attorney, Agent, or Firm* — Thompson Hine LLP; Francois Pagette (57) ABSTRACT

Structures for a field-effect transistor and methods of forming a field-effect transistor. A gate structure of the field-effect transistor is arranged over an active region comprised of a semiconductor material. A first sidewall spacer is arranged adjacent to the gate structure. A second sidewall spacer includes a section arranged between the first sidewall spacer and the active region. The first sidewall spacer is composed of a low-k dielectric material.

20 Claims, 6 Drawing Sheets

FIELD-EFFECT TRANSISTORS WITH DIFFUSION BLOCKING SPACER SECTIONS

BACKGROUND

The present invention relates to semiconductor device fabrication and integrated circuits and, more specifically, to structures for a field-effect transistor and methods of forming a field-effect transistor.

Device structures for a field-effect transistor generally include a body region, a source and a drain defined in the body region, and a gate electrode configured to switch carrier flow in a channel formed during operation in the body region. When a control voltage exceeding a designated threshold voltage is applied to the gate electrode, carrier flow occurs in the channel between the source and drain to produce a device output current. For a planar field-effect transistor, the body region and channel are located beneath the top surface of a substrate on which the gate electrode is supported.

A fin-type field-effect transistor (FinFET) is a non-planar device structure that may be more densely packed in an integrated circuit than planar field-effect transistors. A FinFET may include one or more fins composed of semiconductor material, heavily-doped source/drain regions, and a gate electrode that wraps about a channel located in the fin body between the source/drain regions. The wrapped arrangement between the gate electrode and fin body improves control over the channel and reduces the leakage current when the FinFET is in its 'Off' state in comparison with planar transistors. This, in turn, promotes lower threshold voltages than in planar transistors, and results in improved performance and lowered power consumption.

Device structures for a field-effect transistor include a sidewall spacer arranged to surround the gate electrode. In an effort to reduce capacitance, the sidewall spacer may be composed of a low-k dielectric material characterized by a lower permittivity in comparison with other types of dielectric materials, such as silicon nitride. The reduction in capacitance may be achieved by using a carbon-containing oxide as the low-k dielectric material. However, the carbon contained in the sidewall spacers may be mobile, which permits diffusion from the sidewall spacers into other portions of the field-effect transistor. The unwanted presence of carbon can negatively impact dopant profiles in the source/drain regions. For example, carbon may cluster with a dopant, such as boron, in the source/drain regions and thereby reduce dopant activation.

A low-k sidewall spacer may also be prone to erosion during a replacement gate process. In a less severe case, the erosion results in a lengthening of the gate electrode adding variability to the device electrostatics. In more severe cases, the erosion may permit the formation of a pathway connecting the space formed by the removal of a dummy gate and one or both of the source/drain regions. The pathway is subsequently filled with conductor when the metal gate is formed. This conductor-filled pathway can generate a short between the metal gate electrode and the source/drain region.

Improved structures for a field-effect transistor and methods of forming a field-effect transistor are needed.

SUMMARY

In an embodiment, a structure includes a gate structure an active region comprised of a semiconductor material, a first sidewall spacer adjacent to the gate structure, and a second sidewall spacer including a section arranged between the first sidewall spacer and the active region. The first sidewall spacer is composed of a low-k dielectric material.

In an embodiment, a method includes forming a gate structure over an active region composed of semiconductor material, forming a first sidewall spacer adjacent to the gate structure, and forming a section of a second sidewall spacer arranged between the first sidewall spacer and the active region. The first sidewall spacer is composed of a low-k dielectric material.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
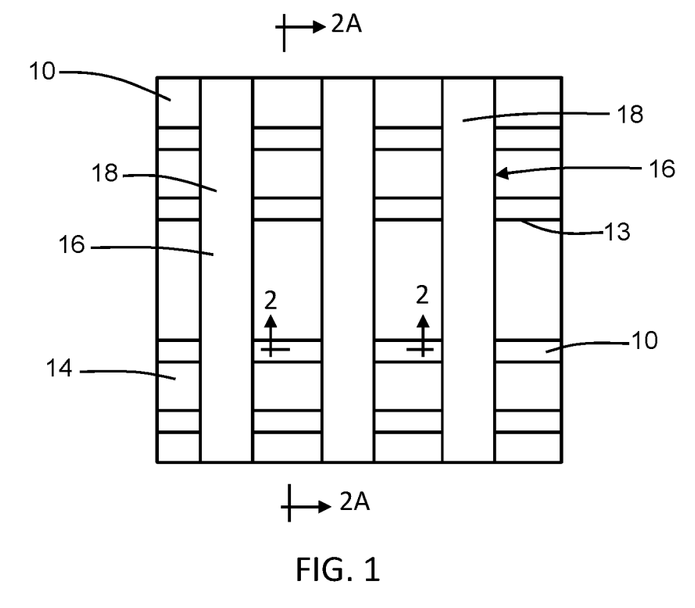
FIG. 1 is a top view of a device structure at an initial fabrication stage of a processing method in accordance with embodiments of the invention.
Figure 2:
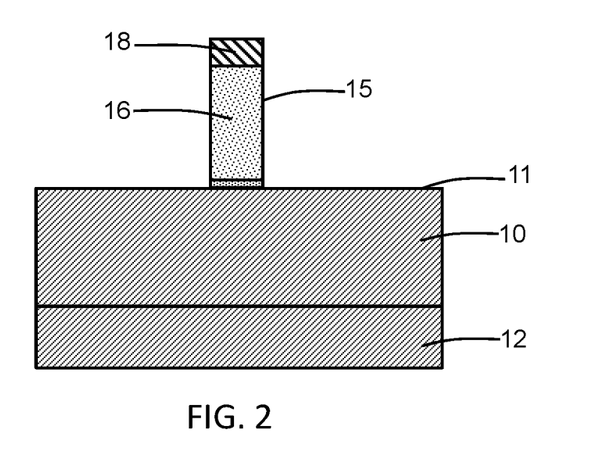
FIG. 2 is a cross-sectional view taken generally along line 2-2 in FIG. 1.
Figure 2A:
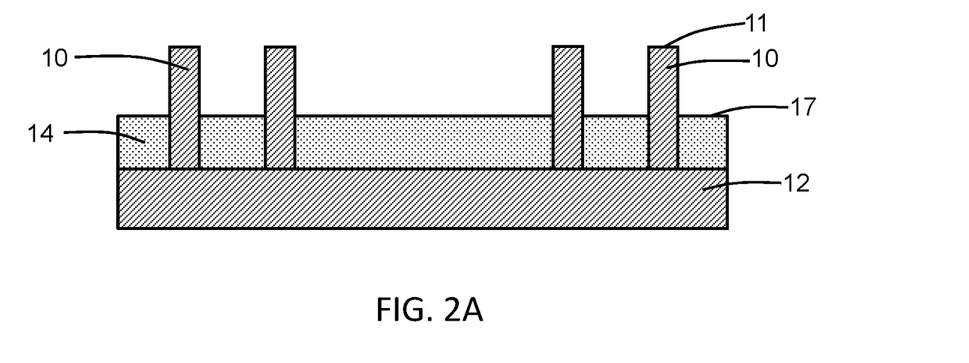
FIG. 2A is a cross-sectional view taken generally along line 2A-2A in FIG. 1.

With reference to FIGS. 1, 2, 2A and in accordance with embodiments of the invention, semiconductor fins 10 are arranged on a substrate 12 and project upwardly from a top surface of the substrate 12. The semiconductor fins 10, which contain a single-crystal semiconductor material such as single-crystal silicon, may be patterned from the semiconductor material of the substrate 12 or an epitaxial layer formed on the substrate 12 using, for example, a sidewall imaging transfer (SIT) process, self-aligned double patterning (SADP), or self-aligned quadruple patterning (SAQP). Each of the semiconductor fins 10 has a top surface 11 and sidewalls 13 that extend from the top surface 11 to the substrate 12.

A dielectric layer 14 is arranged to surround and bury lower sections of the semiconductor fins 10, and upper sections of the semiconductor fins 10 are exposed above a top surface 17 of the dielectric layer 14. In an embodiment, the dielectric layer 14 may be composed of a dielectric material, such as silicon dioxide, deposited by chemical vapor deposition. The dielectric layer 14 may be recessed, subsequent to deposition, with an etching process to expose the upper sections of the semiconductor fins 10. The upper sections of the semiconductor fins 10 extend upwardly from the top surface 17 of the dielectric layer 14 to the top surface 11 of each semiconductor fin 10, and the lower sections of the semiconductor fins 10 are electrically isolated by the dielectric layer 14.

Gate structures 16 are arranged to extend across the semiconductor fins 10 and the top surface 17 of the dielectric layer 14. The gate structures 16, which are lengthwise oriented transverse to the lengths of the semiconductor fins 10 and which may have been cut into segments, overlap with respective channel regions in the semiconductor fins 10 at spaced-apart locations. Each gate structure 16 includes sidewalls 15 that extend upwardly from the dielectric layer 14 and overlap with the top surface 11 and sidewalls 13 of the semiconductor fins 10.

The gate structures 16 may include a dummy gate composed of a polycrystalline semiconductor material, such as polysilicon, and a thin dielectric layer (e.g., silicon dioxide) arranged between the dummy gate and the exterior surfaces (e.g., the top surface 11) of the semiconductor fins 10. The gate structures 16 may be formed by depositing the materials of the dummy gate and thin dielectric layer over the semiconductor fins 10 and the dielectric layer 14, and patterning the materials with lithography and etching processes. The gate structures 16 constitute placeholders that are subsequently removed and replaced by other gate structures.

A gate cap 18 is arranged on the top surface of each gate structure 16. The gate caps 18 may be composed of a dielectric material, such as silicon nitride, deposited by chemical vapor deposition.

Figure 3:
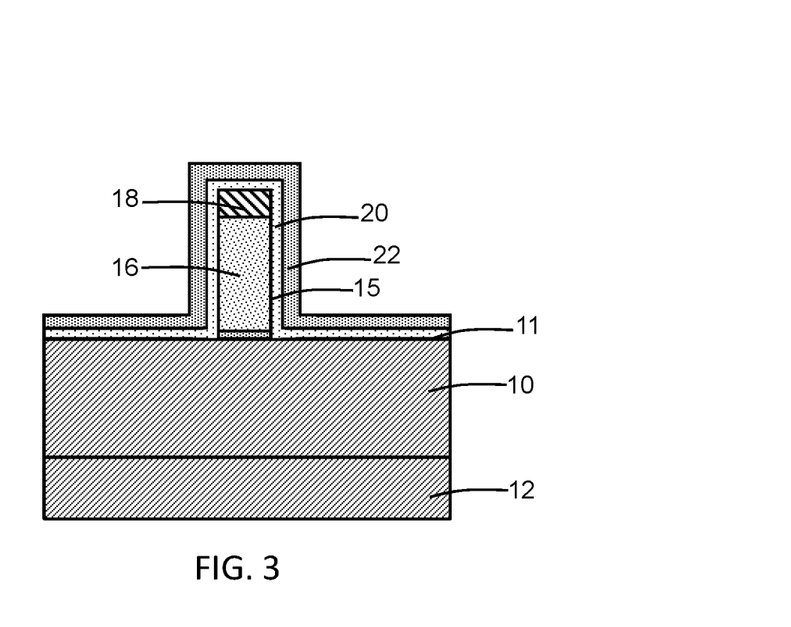
FIGS. 3-8 are cross-sectional views of the device structure at successive fabrication stages subsequent to FIG. 2.

With reference to FIG. 3 in which like reference numerals refer to like features in FIG. 2 and at a subsequent fabrication stage, after formation of the gate structures 16, a dielectric layer 20 is formed over the top surface 11 and sidewalls 13 of the semiconductor fins 10, the dielectric layer 14, and the sidewalls 15 of the gate structures 16. The dielectric layer 20 may be composed of a dielectric material, such as silicon nitride, that is conformally deposited by atomic layer deposition and may have a nominally equal thickness on all coated surfaces with an adopted topology. In an embodiment, the dielectric layer 20 may have a thickness in a range of one (1) nanometer to four (4) nanometers. Following the formation of the dielectric layer 20, the semiconductor fins 10 may be implanted with ions to provide source/drain extensions and halos, as well as to adjust the threshold voltage. The dielectric layer 20 operates as a screening layer that protects the semiconductor fins 10 during implantation.

A dielectric layer 22 is formed over the top surface 11 and sidewalls 13 of each semiconductor fin 10, the dielectric layer 14, and the sidewalls 15 of each gate structure 16. The dielectric layer 20, which is deposited before the deposition of the dielectric layer 22, is arranged between the dielectric layer 22 and the top surface 11 and sidewalls 13 of the semiconductor fins 10, the dielectric layer 14, and the sidewalls 15 of the gate structures 16. The dielectric layer 22 may be composed of a dielectric material having a dielectric constant that is less than the dielectric constant of the dielectric layer 20. For example, the dielectric layer 22 may be composed of a low-k dielectric material containing carbon, such as a carbon-doped silicon oxide like SiOCN or SiOC. The dielectric layer 22 may be conformally deposited by, for example, atomic layer deposition, and may have a nominally equal thickness on all coated surfaces with an adopted topology.

The dielectric layer 20 is not removed, or otherwise etched, following the implantations, which means that the dielectric layer 20 is not removed, or otherwise etched, before the dielectric layer 22 is deposited. Instead, the dielectric layer 20 is retained on the top surface 11 and sidewalls 13 of each semiconductor fin 10, the dielectric layer 14, and the sidewalls 15 of each gate structure 16, and eventually appears in part in the completed device structure. Instead of being fully sacrificial, the dielectric layer 20 is only semi-sacrificial due to the retained portion.

Figure 4:
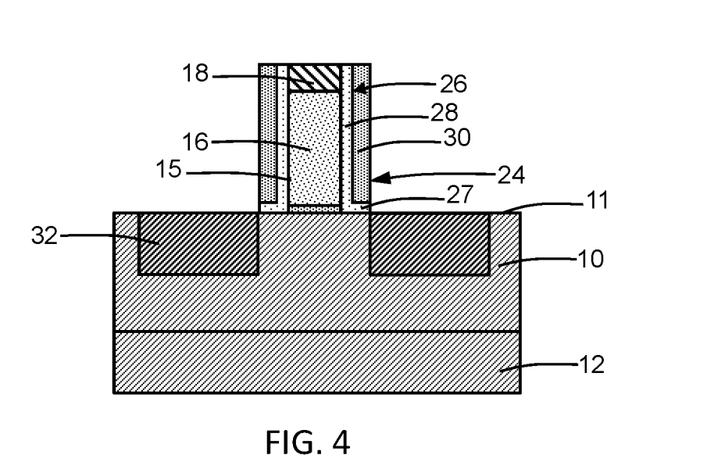

With reference to FIG. 4 in which like reference numerals refer to like features in FIG. 3 and at a subsequent fabrication stage, bilayer spacers 24 are formed by etching the dielectric layer 20 and the dielectric layer 22 with a directional or anisotropic etching process, such as reactive ion etching. Each bilayer spacer 24 is arranged adjacent to the sidewall 15 of an associated one of the gate structures 16. Each bilayer spacer 24 includes an inner sidewall spacer 26 formed by the anisotropic etching process from the dielectric layer 20. Each inner sidewall spacer 26 has an L-shape that includes a section 27 of the dielectric layer 20 and a section 28 of the dielectric layer 20 that extends upwardly from an end of the section 27. Each section 27 of the dielectric layer 20 is arranged over, and is in direct contact with, the top surface 11 of the associated semiconductor fin 10. Each section 28 of the dielectric layer 20 is arranged adjacent to, has a directly contacting relationship, with the sidewall 15 of the associated gate structure 16.

Each bilayer spacer 24 further includes an outer sidewall spacer 30 that is formed by the anisotropic etching process from the dielectric layer 22. One of the sections 28 of the dielectric layer 20 is arranged in a horizontal direction between each outer sidewall spacer 30 and the sidewall 15 of the associated gate structure 16. One of the sections 27 of the dielectric layer 20 is arranged in a vertical direction between each outer sidewall spacer 30 and the top surface 11 of the associated semiconductor fin 10. The dielectric layers 20, 22 may be removed by the anisotropic etching process from the top surface 11 of each semiconductor fin 10 adjacent to the bilayer spacer 24.

Source/drain regions 32 may be formed in each semiconductor fin 10 by etching shaped cavities using an isotropic etching process and/or an anisotropic etching process and epitaxially growing semiconductor material from the semiconductor fins 10. As used herein, the term "source/drain region" means a doped region of semiconductor material that can function as either a source or a drain of a field-effect transistor. The source/drain regions 32 may be composed of epitaxial semiconductor material that is grown in the cavities with an epitaxial growth process and that adopts the shape of the cavities inside the semiconductor fins 10. Outside of the cavities, the epitaxial semiconductor material of the source/drain regions 32 may adopt a faceted shape. The epitaxial semiconductor material may be composed of, for example, silicon germanium (SiGe) or carbon-doped silicon (Si:C), and may include a dopant introduced during growth to provide a given conductivity type. For the formation of a p-type field-effect transistor, the semiconductor material of the source/drain regions 32 may be doped with a p-type dopant (e.g., boron (B)) that provides p-type conductivity. For the formation of an n-type field-effect transistor, the semiconductor material of the source/drain regions 32 may be doped with an n-type dopant (e.g., phosphorus (P) and/or arsenic (As)) that provides n-type conductivity.

The sections 27 of the dielectric layer 20 are arranged between the outer sidewall spacers 30 and the source/drain regions 32 during the growth of, and following the growth of, the source/drain regions 32. The sections 27 of the dielectric layer 20 function as a diffusion barrier that prevents or reduces the thermally-induced migration of a mobile atomic species, such as carbon atoms, from the outer sidewall spacers 30 to the source/drain regions 32.

Figure 5:
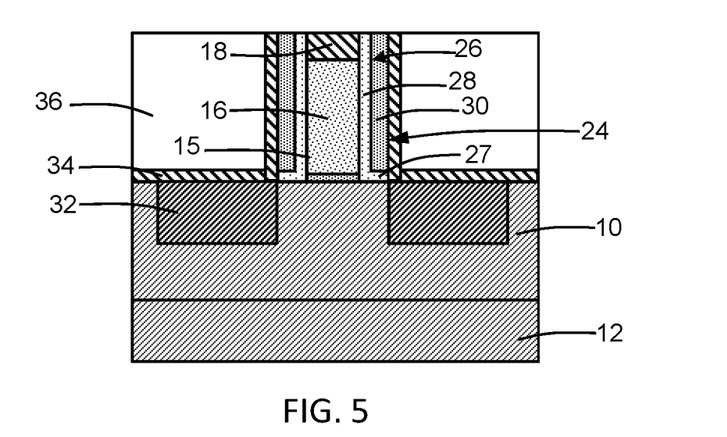

With reference to FIG. 5 in which like reference numerals refer to like features in FIG. 4 and at a subsequent fabrication stage, a conformal contact etch stop layer (CESL) 34 and an interlayer dielectric layer 36 are sequentially deposited. The CESL 34 may be composed of a thin layer of a dielectric material, such as silicon nitride, conformally deposited by atomic layer deposition. The interlayer dielectric layer 36 may be composed of a dielectric material, such as silicon dioxide, that is blanket deposited by chemical vapor deposition and planarized. The CESL 34 coats the source/drain regions 32 and the outer sidewall spacers 30, and is arranged between sections of the interlayer dielectric layer 36 and the source/drain regions 32.

Figure 6:
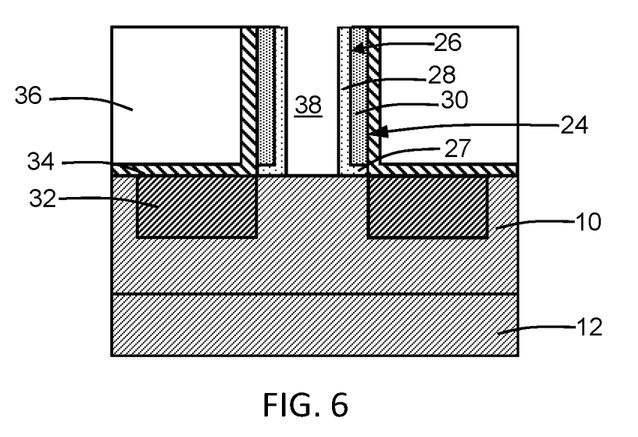

With reference to FIG. 6 in which like reference numerals refer to like features in FIG. 5 and at a subsequent fabrication stage, the gate structures 16 and their gate caps 18 are removed to define openings 38 as part of a replacement metal gate process. The sections 28 of the inner sidewall spacers 26 are exposed inside each opening 38 following the removal of the gate structures 16.

Figure 7:
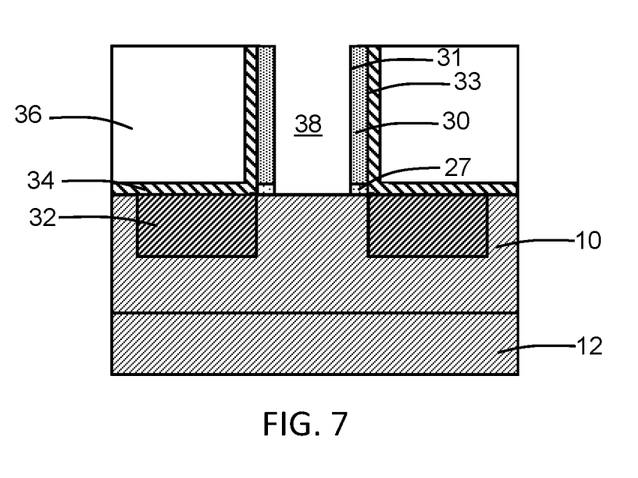

With reference to FIG. 7 in which like reference numerals refer to like features in FIG. 6 and at a subsequent fabrication stage, after removing the gate structures 16, the exposed sections 28 of the inner sidewall spacers 26 are removed inside each opening 38 with an etching process, such as a wet chemical etching process using a buffered hydrofluoric acid solution. The etching process may remove the dielectric material constituting the inner sidewall spacers 26 selective to the dielectric material constituting the outer sidewall spacers 30. The sections 27 of the inner sidewall spacers 26 are masked and covered during the etching process by the outer sidewall spacers 30.

The sections 27 of the inner sidewall spacers 26 are arranged below the outer sidewall spacers 30 and, therefore, between the outer sidewall spacers 30 and the top surface 11 of each semiconductor fin 10. Each section 27 is laterally arranged between an inner edge 31 and an outer edge 33 of the associated overlying sidewall spacer 30. During the etching process removing the gate structures 16, the sections 27 of the inner sidewall spacers 26 protect the underlying source/drain regions 32 and/or semiconductor fin 10 against etching, which reduces the risk of shorting between the subsequently-formed metal gate structures and the source/drain regions 32. The removal of the sections 28 of the inner sidewall spacers 26 slightly widens the openings 38. This widening is controlled and contained by the etch selectivity between the material of the inner sidewall spacers 26 and the material of the outer sidewall spacers 30.

Figure 8:
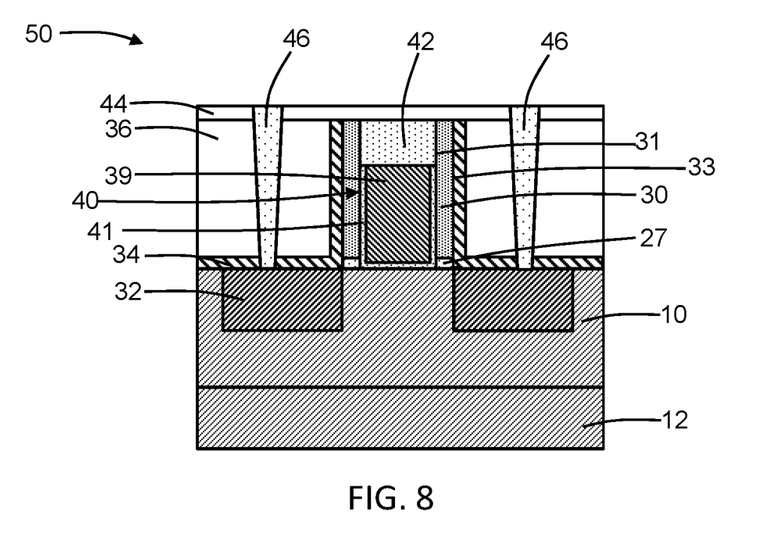

With reference to FIG. 8 in which like reference numerals refer to like features in FIG. 7 and at a subsequent fabrication stage, after removing the sections 28 of the inner sidewall spacers 26, a gate structure 40 and a gate cap 42 are formed in each opening 38 to complete the formation of field-effect transistors 50 having the representative form of fin-type field-effect transistors with the semiconductor material of the semiconductor fins 10 providing respective active regions. Each gate structure 40 may include a gate electrode 39 and a gate dielectric 41 arranged between the gate electrode 39 and each overlapped semiconductor fin 10. The gate electrode 39 may include one or more conformal barrier metal layers and/or work function metal layers, such as metal layers composed of titanium aluminum carbide and/or titanium nitride, and/or a metal gate fill layer composed of a conductor, such as tungsten, cobalt, or aluminum. The gate dielectric 41 may be composed of a high-k dielectric material, such as hafnium oxide. The gate caps 42 may be composed of a dielectric material, such as silicon nitride, and may be formed over gate structures 40 that may be recessed relative to the outer sidewall spacers 30.

The inner edge 31 of each outer sidewall spacer 30 is in direct contact with the associated gate structure 40, and the outer edge 33 of each outer sidewall spacer 30 is spaced from the inner edge 31 by the thickness of the outer sidewall spacer 30. The section 27 of each inner sidewall spacer 26 may extend with a uniform thickness from the inner edge 31 of the associated outer sidewall spacer 30 to the outer edge 33 of the associated sidewall spacer 30. In an embodiment, each section 27 may be aligned with the inner edge of the respective overlying outer sidewall spacer 30. Each section 27 may be in direct contact with the associated gate structure 40 over an area below the inner edge 31 of the associated outer sidewall spacer 30. In an embodiment, each section 27 may be in direct contact with the associated gate structure 40 over an area that is directly below the inner edge 31 of the associated outer sidewall spacer 30. Each section 27 may terminate at, or proximate to, the outer edge 33 of the outer sidewall spacer 30.

A cap layer 44 is formed over the interlayer dielectric layer 36 after the gate structures 40 are formed. Contacts 46 are formed in contact openings that extend through the cap layer 44, interlayer dielectric layer 36, and the CESL 34 to the source/drain regions 32. The contacts 46 may contain a metal silicide, such as tungsten silicide, titanium silicide, nickel silicide, or cobalt silicide, and a metal fill, such as tungsten, that are deposited and planarized.

Figure 9:
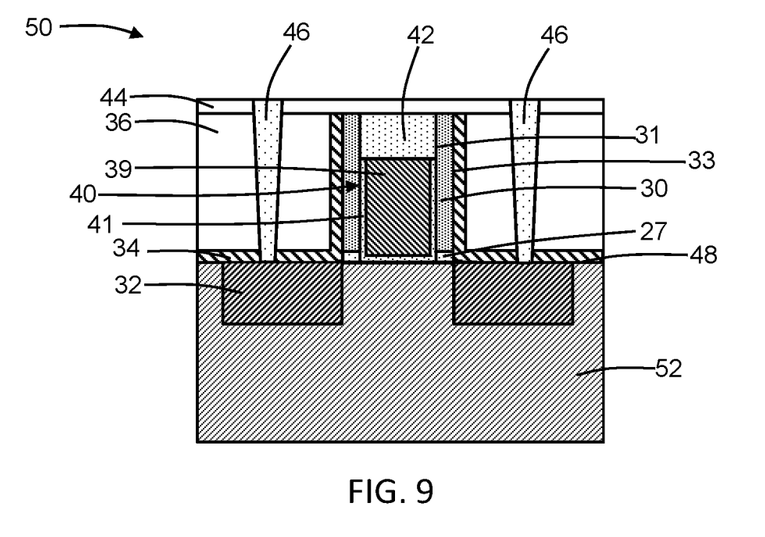
FIGS. 9 and 10 are cross-sectional views of a device structure in accordance with embodiments of the invention.
Figure 10:
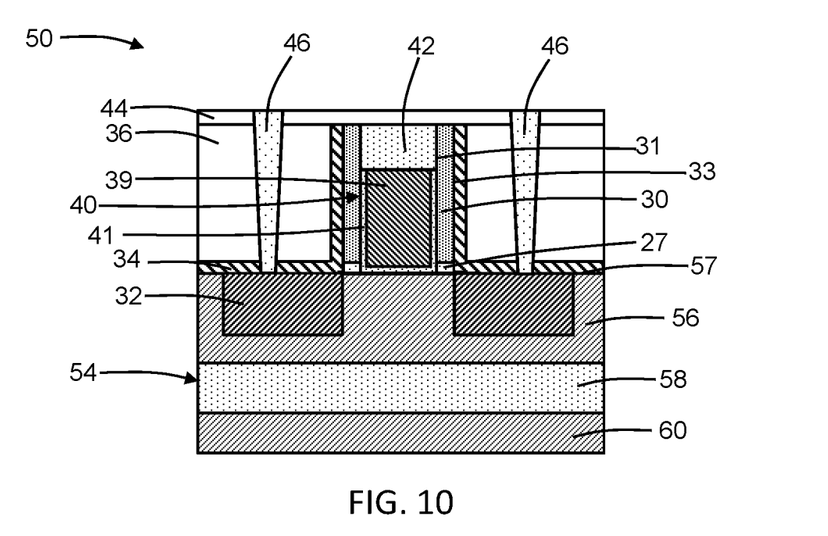

With reference to FIGS. 9, 10 in which like reference numerals refer to like features in FIG. 8 and in accordance with alternative embodiments of the invention, the field-effect transistors 50 may be formed, as previously described, based on the use of active regions other than semiconductor fins 10. In particular, the field-effect transistors 50 may be fabricated as planar device structures rather than fin-type device structures.

For example and as shown in FIG. 9, each field-effect transistor 50 may include an active region of single-crystal semiconductor material (e.g., single-crystal silicon) provided by a portion of a bulk semiconductor substrate 52. The section 27 of each inner sidewall spacer 26 is arranged in a vertical direction between a top surface 48 of the bulk semiconductor substrate 52 and the outer sidewall spacer 30 and, in an embodiment, may be arranged in direct contact with the top surface 48 of the bulk semiconductor substrate 52. The active region may be defined in the bulk semiconductor substrate 52 by shallow trench isolation regions furnishing the dielectric layer 14.

As another example and as shown in FIG. 10, each field-effect transistor 50 may include an active region of single-crystal semiconductor material (e.g., single-crystal silicon) provided by a portion of a device layer 56 of a semiconductor-on-insulator (SOI) wafer 54. The SOI wafer 54 further includes a buried insulator layer 58 and a substrate 60 in addition to the device layer 56. The device layer 56 is separated from the substrate 60 by the intervening buried insulator layer 58 and may be considerably thinner than the substrate 60. The device layer 56 and the substrate 60 may be composed of a single-crystal semiconductor material, such as single-crystal silicon, and the buried insulator layer 58 may be a buried oxide (BOX) layer. The section 27 of each inner sidewall spacer 26 is arranged in a vertical direction between an outer sidewall spacer 30 and a top surface 57 of the device layer 56 in a vertical direction and, in an embodiment, may be arranged in direct contact with the top surface 57 of the device layer 56. The active region may be defined in the device layer by shallow trench isolation regions furnishing the dielectric layer 14, and the shallow trench isolation regions may penetrate through a full thickness of the device layer 56 to the buried insulator layer 58.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or "in direct contact with" another feature if intervening features are absent. A feature may be "indirectly on" or "in indirect contact with" another feature if at least one intervening feature is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor region comprised of a semiconductor material;
   a gate structure over the semiconductor region;
   a first sidewall spacer adjacent to the gate structure, the first sidewall spacer comprised of a low-k dielectric material, and the first sidewall spacer having an inner edge in direct contact with the gate structure and an outer edge; and
   a second sidewall spacer including a section arranged between the first sidewall spacer and the semiconductor region, the section of the second sidewall spacer extending from the inner edge to the outer edge,
   wherein the low-k dielectric material contains carbon, and the section of the second sidewall spacer is comprised of silicon nitride.

2. The structure of claim 1 wherein the section of the second sidewall spacer is comprised of a dielectric material having a first dielectric constant, and the low-k dielectric material has a second dielectric constant that is less than the first dielectric constant.

3. The structure of claim 1 wherein the section of the second sidewall spacer has a uniform thickness.

4. The structure of claim 1 wherein the section of the second sidewall spacer is in direct contact with the gate structure below the inner edge of the first sidewall spacer.

5. The structure of claim 1 wherein the section of the second sidewall spacer terminates at the outer edge of the first sidewall spacer.

6. The structure of claim 1 further comprising:
   a source/drain region associated with the semiconductor region,
   wherein the section of the second sidewall spacer is arranged between the first sidewall spacer and the source/drain region.

7. The structure of claim 1 wherein the semiconductor region comprises a semiconductor fin, and the gate structure has an overlapping relationship with the semiconductor fin.

8. The structure of claim 1 wherein the semiconductor region comprises a portion of a bulk semiconductor substrate or a portion of a device layer of a semiconductor-on-insulator wafer.

9. A structure comprising:
   a semiconductor region comprised of a semiconductor material;
   a gate structure over the semiconductor region;
   a first sidewall spacer adjacent to the gate structure, the first sidewall spacer comprised of a low-k dielectric material, and the first sidewall spacer having an inner edge in direct contact with the gate structure and an outer edge; and
   a second sidewall spacer including a section arranged between the first sidewall spacer and the semiconductor region, the section of the second sidewall spacer extending from the inner edge to the outer edge,
   wherein the low-k dielectric material is a carbon-doped silicon oxide, and the section of the second sidewall spacer is comprised of silicon nitride.

10. The structure of claim 9 wherein the section of the second sidewall spacer has a uniform thickness.

11. The structure of claim 9 wherein the section of the second sidewall spacer is in direct contact with the gate structure below the inner edge of the first sidewall spacer.

12. The structure of claim 9 wherein the section of the second sidewall spacer terminates at the outer edge of the first sidewall spacer.

13. A method comprising:
   forming a first gate structure over a semiconductor region comprised of semiconductor material;
   forming a first sidewall spacer adjacent to the first gate structure; and
   forming a first section of a second sidewall spacer arranged between the first sidewall spacer and the semiconductor region,
   wherein the first sidewall spacer has an inner edge in direct contact with the first gate structure and an outer edge, the first section of the second sidewall spacer extends from the inner edge to the outer edge, the first sidewall spacer is comprised of a low-k dielectric material, and the low-k dielectric material contains carbon, and the first section of the second sidewall spacer is comprised of silicon nitride.

14. The method of claim 13 wherein a second gate structure is removed as part of a replacement metal gate process to form the first gate structure, and forming the first section of the second sidewall spacer arranged between the first sidewall spacer and the semiconductor region comprises:
  depositing a conformal layer on the semiconductor region and on a sidewall of the first second gate structure.

15. The method of claim 14 further comprising:
  etching the conformal layer to form the first section and a second section of the second sidewall spacer on the sidewall of the second gate structure;
  removing the second gate structure to define an opening that exposes the second section of the second sidewall spacer;
  after removing the second gate structure, removing the second section of the second sidewall spacer with an etching process; and
  forming the first gate structure in the opening.

16. The method of claim 13 wherein a second gate structure is removed as part of a replacement metal gate process to form the first gate structure, and forming the first sidewall spacer adjacent to the first gate structure comprises:
  depositing a first conformal layer over the second gate structure and the semiconductor region;
  depositing a second conformal layer comprised of the low-k dielectric material over the first conformal layer; and
  etching the second conformal layer to form the first sidewall spacer.

17. The method of claim 16 wherein forming the first section of the second sidewall spacer arranged between the first sidewall spacer and the semiconductor region comprises:
  after forming the first sidewall spacer, etching the first conformal layer to form the second sidewall spacer.

18. The method of claim 13 wherein the first section of the second sidewall spacer has a uniform thickness.

19. The method of claim 13 wherein the first section of the second sidewall spacer is in direct contact with the first gate structure below the inner edge of the first sidewall spacer.

20. The method of claim 13 wherein the first section of the second sidewall spacer terminates at the outer edge of the first sidewall spacer.

* * * * *